(12) United States Patent
Stimson et al.

(10) Patent No.: US 6,723,214 B2
(45) Date of Patent: Apr. 20, 2004

(54) APPARATUS FOR IMPROVED POWER COUPLING THROUGH A WORKPIECE IN A SEMICONDUCTOR WAFER PROCESSING SYSTEM

(75) Inventors: Bradley O. Stimson, San Jose, CA (US); Mitsuhiro Kaburaki, Narita (JP); John C. Forster, San Francisco, CA (US); Eric Delaurentis, Boulder Creek, CA (US); Praburam Gopalraja, Sunnyvale, CA (US); Patricia Rodriguez, Santa Clara, CA (US); Anantha Subramani, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 273 days.

(21) Appl. No.: 10/039,907

(22) Filed: Jan. 2, 2002

(65) Prior Publication Data

US 2002/0053513 A1 May 9, 2002

Related U.S. Application Data

(63) Continuation of application No. 09/182,023, filed on Oct. 29, 1998, now abandoned.

(51) Int. Cl.[7] .................... C23C 14/00; C23C 16/00; B05C 13/00; C23F 1/00
(52) U.S. Cl. .................... 204/298.15; 204/298.11; 118/500; 118/728; 156/345.51
(58) Field of Search .............. 204/298.15, 298.11, 204/298.09, 298.06; 118/500, 503, 728; 156/345.51

(56) References Cited

U.S. PATENT DOCUMENTS

| 4,367,114 A | 1/1983 | Steinberg et al. ......... 156/345 |
|---|---|---|
| 4,384,918 A | 5/1983 | Abe ......................... 156/643 |
| 4,796,562 A | 1/1989 | Brors et al. ................ 118/725 |
| 4,897,171 A | 1/1990 | Ohmi ......................... 204/298 |
| 5,228,501 A | 7/1993 | Tepman et al. ............ 165/80.1 |
| 5,262,029 A | 11/1993 | Erskine et al. ......... 204/298.15 |
| 5,494,523 A | 2/1996 | Steger et al. ............. 118/723 E |
| 5,540,821 A | 7/1996 | Tepman ................. 204/192.13 |
| 5,560,780 A | 10/1996 | Wu et al. ................... 118/728 |
| 5,569,350 A | * 10/1996 | Osada et al. ................ 156/345 |
| 5,611,865 A | 3/1997 | White et al. ................. 118/725 |
| 5,716,486 A | 2/1998 | Selwyn et al. .............. 156/345 |
| 5,725,718 A | 3/1998 | Banholzer et al. .......... 156/345 |
| 5,803,977 A | * 9/1998 | Tepman et al. ............. 118/728 |
| 5,804,042 A | 9/1998 | Ferreira et al. ......... 204/192.12 |
| 5,942,042 A | * 8/1999 | Gogh ......................... 118/728 |

FOREIGN PATENT DOCUMENTS

| EP | 0 624 896 A1 | 11/1994 | ............ H01J/37/32 |
|---|---|---|---|
| EP | 0 732 728 A2 | 9/1996 | ............ H01J/37/32 |
| WO | 98/53482 | 11/1998 | ............ H01J/37/32 |

* cited by examiner

Primary Examiner—Patrick Ryan
Assistant Examiner—Julian Mercado
(74) Attorney, Agent, or Firm—Moser, Patterson & Sheridan

(57) ABSTRACT

Apparatus for supporting a substrate such as a semiconductor wafer in a process chamber to improve power coupling through the substrate. The apparatus contains a pedestal assembly and a pedestal cover positioned over the top surface of and circumscribing the pedestal assembly for electrically isolating the pedestal assembly. The pedestal cover reduces conductive film growth in the wafer process region. As such, RF wafer biasing power from the pedestal assembly remains coupled through the substrate during processing.

22 Claims, 4 Drawing Sheets

APPARATUS FOR IMPROVED POWER COUPLING THROUGH A WORKPIECE IN A SEMICONDUCTOR WAFER PROCESSING SYSTEM

CROSS-REFERENCE TO RELATED APPLICATIONS

This application is a continuation of co-pending U.S. patent application Ser. No. 09/182,023, filed Oct. 29, 1998, herein incorporated by reference.

BACKGROUND OF THE INVENTION

1. Field of the Invention

The present invention generally relates to a plasma-enhanced processing of semiconductor wafers and, more specifically, to an apparatus for improving voltage stability on a workpiece and electrical coupling between a plasma and the workpiece in a semiconductor wafer processing system.

2. Description of the Related Art

Plasma-enhanced reactions and processes have become increasingly important to the semiconductor industry, providing for precisely controlled thin-film depositions. For example, a plasma reactor in a high-temperature physical vapor deposition (PVD) semiconductor wafer processing system generally comprises a reaction chamber for containing a working gas, a pair of spaced-apart electrodes (cathode and anode) that are driven by a high power DC voltage to generate an electric field within the chamber, and a substrate support or pedestal for supporting a substrate within the chamber. The cathode is typically a target material that is to be sputtered or deposited onto the substrate, while the anode is typically a grounded chamber component. The electric field creates a reaction zone where electrons are captured near the cathode surface. This condition increases the number of ionizing collisions the electrons have with working gas neutral atoms, thereby ionizing the working gas into a plasma. The plasma, characterized by a visible glow, forms as a mixture of positive ions, neutrals and negative electrons. Ions from the plasma bombard the negatively biased target releasing deposition material. As such, a deposited film forms on the substrate which is supported and retained upon the surface of the pedestal. Additionally, hardware is used to prevent deposition from occurring in unwanted locations. For example, a waste ring and a cover ring prevent deposition material from being deposited on surfaces other than the substrate and process shields.

To further enhance deposition in an ion metallization system, a specific type of PVD system, the substrate and pedestal are biased negatively with respect to the plasma. This is accomplished by providing RF power to the pedestal. A negative DC offset accumulates on the pedestal as a result of the higher mobility of electrons as compared to the positive ions in the plasma. In some processes, as neutral target material is sputtered from the target and enters the plasma, the target material becomes positively ionized. With the negative DC offset at the pedestal, the positively ionized target material is attracted to and deposits on the substrate in a highly perpendicular manner. That is, the horizontal component of acceleration and/or velocity of the positive ion is reduced while the vertical component is enhanced. As such, the deposition characteristic known as "step coverage" is improved. Ordinarily, a 400 KHz AC source is used to bias the pedestal, but other frequency sources such as a 13.56 MHz source may also be used.

Ideally, the voltage magnitude at the substrate (i.e., a semiconductor wafer) remains stable during processing and is reproducible from wafer-to-wafer over an entire processing cycle. That is, the voltage level at the wafer remains constant as the target material is being deposited onto the wafer. A stable voltage level at the wafer causes the ionized deposition material to be drawn uniformly to the wafer. A uniform deposition film layer is a highly desirable characteristic in the semiconductor wafer manufacturing industry. Additionally, the same stable voltage magnitude must reproduce or occur as each new wafer is processed. Reproducing the same stable voltage magnitude for each new wafer is also desirable as it reduces the amount of improperly processed wafers and improves the accuracy of the film deposition amongst a batch of wafers. As such, overall quality of manufactured product increases.

The characteristics of voltage stability and reproducibility are optimized when the wafer is the only electrical conductor in direct contact with the plasma. That is, voltage stability and reproducibility are maintained when the wafer forms the path of least resistance for the RF power to couple through. Existing pedestal configurations allow for various electrical paths wherein voltage stability is compromised. Specifically, stability is compromised due to the hysteresis effect of power coupling through multiple paths to the plasma. One such electrical path establishes through one of the aforementioned rings in the process chamber. The rings (which are in electrical contact to the pedestal) are made of conductive material (e.g., stainless steel) which have instantaneous impedance values that are lower than the impedance of the pedestal/wafer combination. As such, the RF power couples to the plasma through one or more of the rings in lieu of, or in addition to, a path through the wafer. When a ring becomes the momentary path of least resistance, energy losses in the system and voltage instability at the wafer occurs. The resultant instability of the wafer voltage causes the aforementioned nonuniformity of film deposition on the wafer. For example, coverage of the bottom of particular feature (i.e., trench) on the wafer is not as thick as the sidewalls. Process repeatability (the ability to duplicate identical process conditions for a large number of individually processed wafers) also suffers as a result of the aforementioned undesirable conditions.

Consequently, there is a need to electrically enhance and thereby define a primary conductive path from the pedestal to the plasma, via the wafer. Defining such a path stabilizes wafer voltage thereby improving the deposition process. Therefore, there is a need in the art for an apparatus that optimally conducts power from a pedestal through the wafer and plasma to optimize wafer voltage stability and process condition reproducibility.

SUMMARY OF THE INVENTION

The disadvantages heretofore associated with the prior art are overcome by an apparatus for optimally coupling power through a wafer in a semiconductor wafer processing system. The inventive apparatus has a pedestal assembly and a pedestal cover positioned over a top surface of and circumscribing the pedestal assembly for electrically isolating the pedestal assembly. The pedestal assembly further comprises a lower shield member, an insulating plate member disposed upon the lower shield member with the pedestal disposed upon the insulating plate member and an insulative isolator ring disposed upon an outer flange portion of the lower shield member such that a lower, horizontal portion of said isolator ring is below and spaced apart from the pedestal. A plurality of rest buttons provided in a plurality of hollow portions in the pedestal assembly and passing through a plurality of openings in the pedestal cover support the wafer above the pedestal cover.

In sum, the pedestal cover defines a conductive pathway for coupling RF wafer biasing power during wafer processing. By selecting the appropriate frequencies and pedestal cover materials, RF wafer biasing power couples only through the wafer and not through neighboring pedestal components which may exhibit instantaneous conductive characteristics. As such, voltage stability at the wafer and process condition reproducibility is maintained which improves ion deposition from the plasma.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE PREFERRED EMBODIMENT

Figure 1:
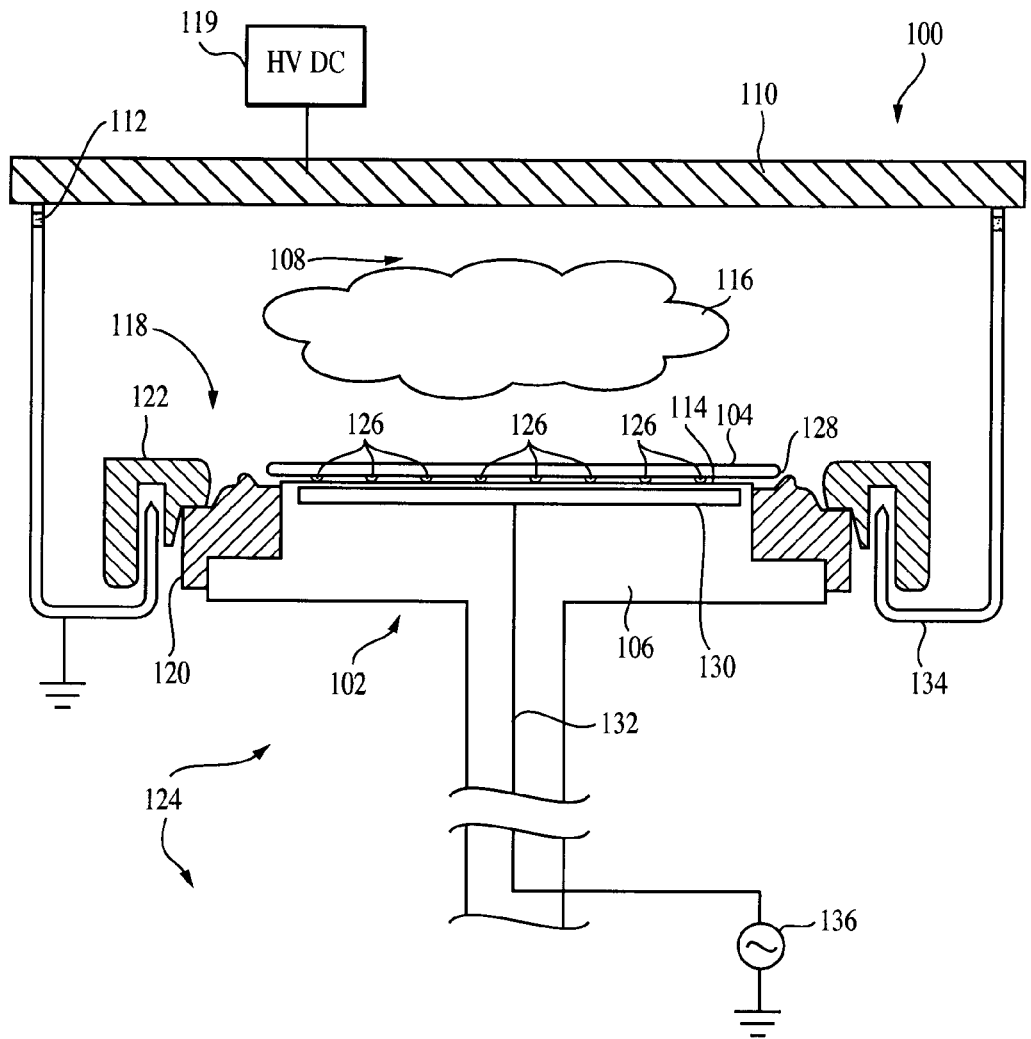
FIG. 1 is a cross-sectional view of a prior art pedestal in a wafer processing chamber.

FIG. 1 depicts a cross-sectional, simplified view of the middle of a conventional PVD wafer processing chamber 100. The chamber 100 contains a conventional pedestal assembly 102 used to support and retain a wafer 104 in the chamber 100. The pedestal assembly 102 comprises a pedestal 106 having a surface 114 that supports the wafer 104. Specifically, the wafer is supported on a disc-like surface having an array of buttons 126 upon which the wafer 104 rests. A chamber lid 110 at the top of the chamber 100 contains deposition target material (e.g., titanium) and is negatively biased by a DC source 119 to form a cathode. Alternately, a separate target is suspended from the chamber lid 110. The chamber lid 110 is electrically insulated from the remainder of the chamber 100 and the chamber 100 is at ground potential. Specifically, insulator ring 112, electrically isolates the chamber lid 110 from a grounded annular shield member 134 which forms an anode.

An electric field is induced in a reaction zone 108 between the cathode chamber lid 110 and anode shield member 134 when the DC source 119 is switched on. A working gas is provided to the reaction zone 108 via a working process gas supply (not shown). The electric field created by the DC source 119 ionizes the working gas and creates a uniform, high-density, low electron temperature plasma 116.

Additionally, an electrode 130, acts as an additional cathode for conducting additional electrical power during wafer processing. Ideally, the entire pedestal assembly 102 is fabricated from a conductive material (i.e., stainless steel) and functions as the cathode. Alternately, the electrode can be a conductive material embedded in a dielectric material of the pedestal 106, (e.g., a thin copper layer sealed in polyimide and adhered to the surface 114 of the pedestal 106) or the pedestal is fabricated of a dielectric material (a ceramic) having an embedded electrode. The electrode 130 (or pedestal 102 itself) is electrically connected via connector 132 to an RF power source 136. The RF power source 136 provides electrical power necessary to bias the wafer to improve film deposition. That is, a negative DC bias forms on the wafer as discussed previously. This DC bias has a local effect of attracting sputtered ions of target material which deposit on the wafer.

The chamber 100 also has a ring assembly 118 to prevent sputtered ions from depositing on chamber components (e.g., the pedestal 106) inadvertently. Specifically, one or more rings circumscribe the pedestal assembly 102. For example, a waste ring 120 abuts the pedestal 106 and radially extends therefrom. The waste ring 120 captures stray target material that would otherwise be improperly deposited on the pedestal 106. A cover ring 122 slightly overlaps and radially extends from the waste ring 120. The cover ring 122 prevents deposition on the lower region and surfaces 124 of the chamber 100. Additionally, annular shield member 134 is suspended from the chamber lid 110 and defines the lateral extremities of the reaction zone 108.

The rings are also fabricated of conductive material (e.g., stainless steel) that provide an alternate electrically conductive path for the RF power from power source 136 to couple to the plasma 116. As a wafer 104 is placed on the pedestal 106, an outer edge 128 of the wafer 104 overhangs the waste ring 120. If the lowest impedance path is not through the wafer 104, the RF power couples to the plasma via another path (i.e., one of the aforementioned rings). As such, the voltage on the wafer 104 becomes unstable and nonreproduceable. Sputtered ions in the plasma are directed away from the wafer thereby creating nonuniform film deposition on the wafer. Additionally, metal from the ring may be sputtered onto the wafer causing contamination.

Figure 2:
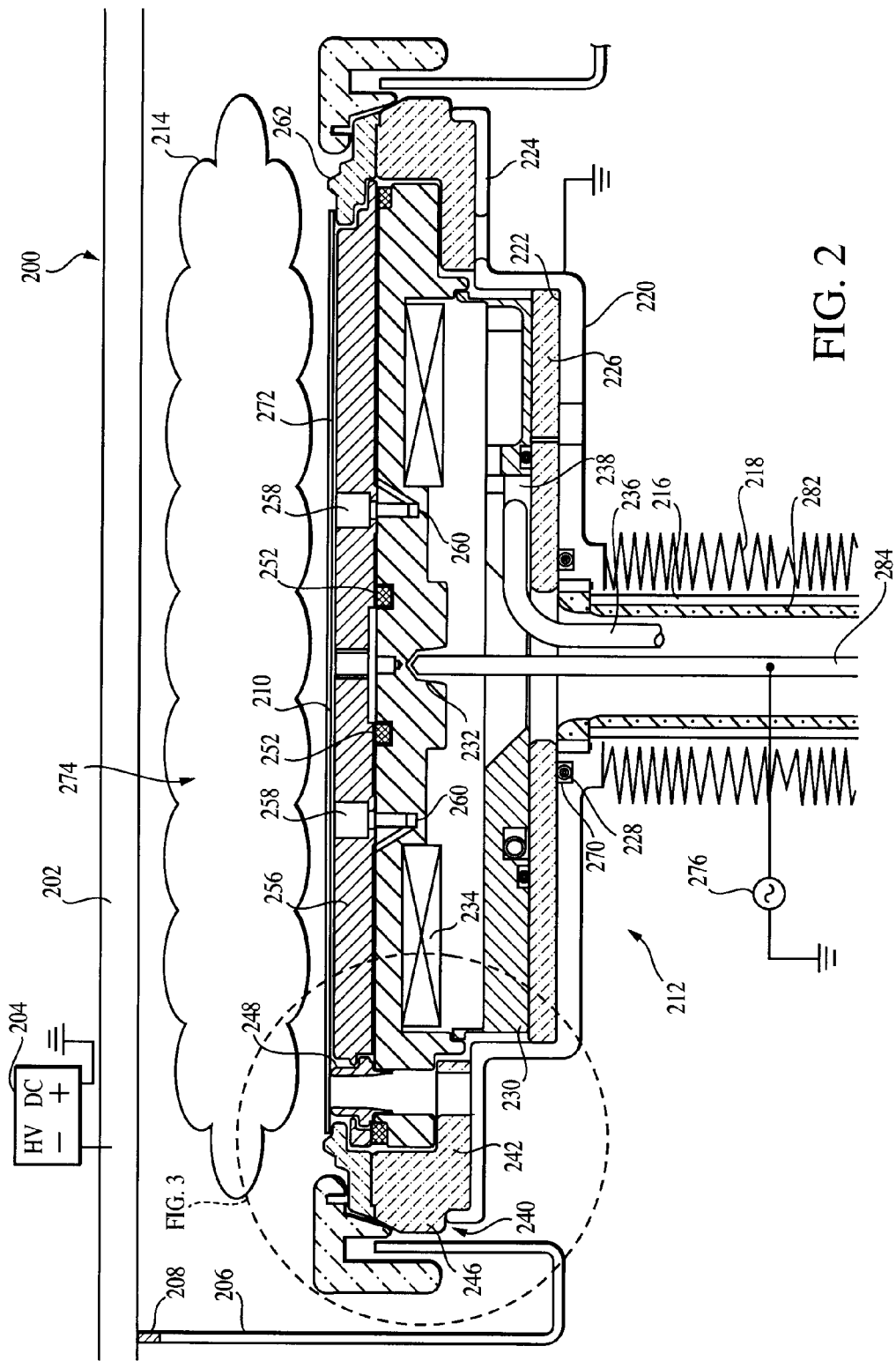
FIG. 2 is a cross-sectional view of inventive apparatus.
Figure 3:
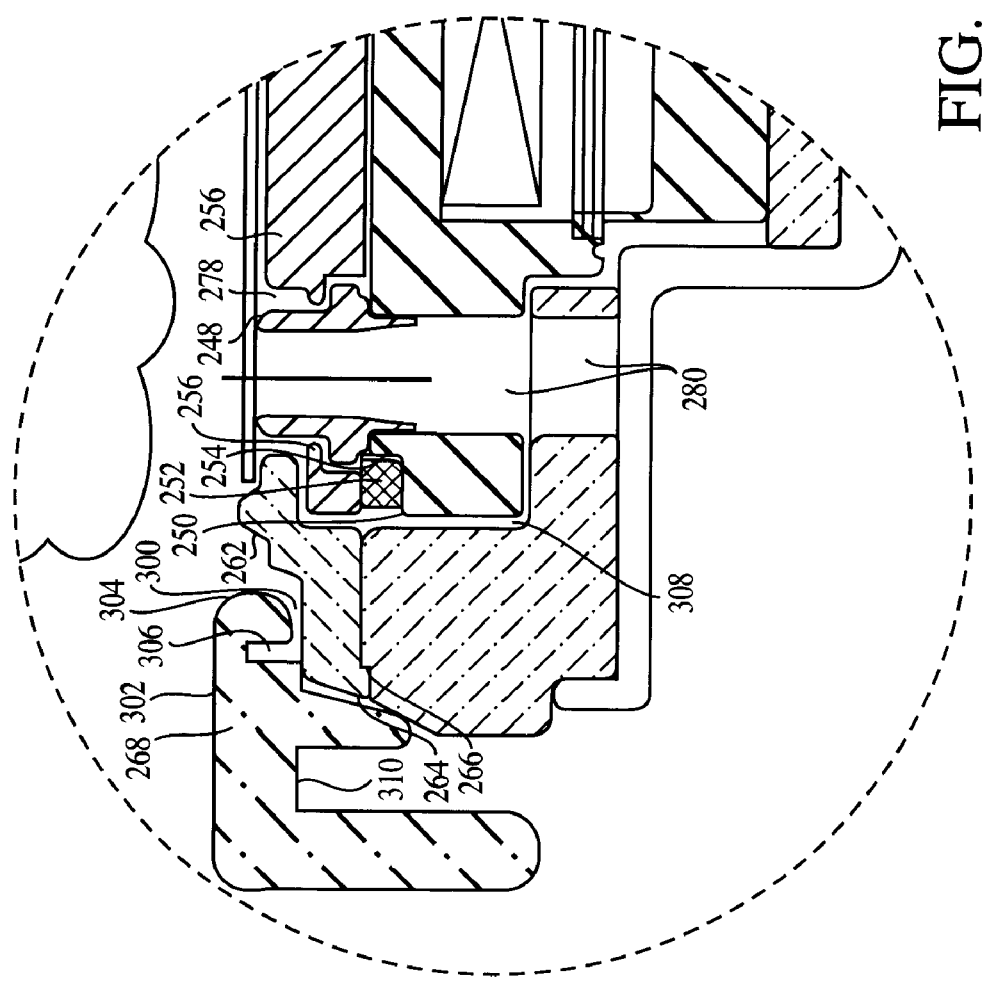
FIG. 3 is a detailed cross-sectional view of the inventive apparatus.

The inventive apparatus is shown in FIG. 2, with a close-up, detailed view shown in FIG. 3. As such, the reader should refer to FIGS. 2 and 3 simultaneously. A high-density, plasma-enhanced reaction chamber 200 is depicted for processing substrates, i.e., a semiconductor wafer. The chamber 200 has all of the necessary elements for processing a semiconductor wafer similar to a chamber 100 as seen in FIG. 1. For example, chamber lid 202 containing target material is negatively biased via a DC source 204 and is insulated from additional chamber components. Such other components include but are not limited to a grounded annular shield member 206 which is insulated from the lid 202 via insulator 208. A semiconductor wafer 210 is supported and retained by a pedestal assembly 212. The pedestal assembly 212 is designed and constructed to form a highly defined electrical pathway for RF power to couple through the pedestal assembly 212 to the wafer 210, through a plasma 214 generated within the chamber 200 and eventually to ground through a grounded chamber component.

A shaft 216 rises up from the chamber floor (not shown) to support the pedestal assembly 212. Additionally the shaft 216 is surrounded in a bellows 218 to seal the chamber 200 from atmospheric conditions existing with the shaft 216. An insulator sleeve 282 is disposed radially inward of the shaft 216. The insulator sleeve 282 keeps the shaft 216 insulated from electrical sources described below. Preferably, the insulator sleeve is fabricated of an insulating material such as ceramic or Teflon. A lower shield member 220 is connected to the shaft 216 and bellows 218 to form a platform upon which the remaining pedestal assembly components are constructed. As discussed earlier, a negative DC offset appears at a pedestal assembly during plasma processing. This offset attracts positively ionized target material that subsequently deposits on a negatively charged surface. The lower shield member 220 is grounded to act as an electrical shield against stray plasma deposition upon the pedestal assembly 212.

The lower shield member 220 has a lower cup portion 222 and an outer flange portion 224. An insulating plate member 226 is disposed within the lower cup portion 222 of the shield member 220. Preferably, the plate member is an insulating material and ideally is ceramic. An O-ring gasket 228 is disposed within a recess 270 of the lower cup portion 222 of the lower shield member 220 to further seal the pedestal assembly 212 from atmospheric conditions. A pedestal 230 is disposed above the insulating plate member 226 and vertically and radially extends above the flange portion 224 of the lower shield member 220. An isolator ring 240 is disposed upon the outer flange portion 224 of the shield member 220. Specifically, the isolator ring 240 is L-shaped wherein a lower, horizontal portion of the ring 242 is below and spaced apart from a portion of the pedestal 230 that overhangs the outer flange portion 224 of the shield member 220. A vertical portion 246 of the isolator ring 240 is also spaced apart from and radially outwards of the pedestal 230. Preferably the isolator ring 240 is made of electrically insulating material, and in a preferred embodiment is a dielectric material such as ceramic, alumina or aluminum nitride.

The pedestal 230 may comprise one or more accessories necessary to perform semiconductor wafer processing such as, but not limited to one or more electrical contacts 232 connected to an RF power source 276 via a power source feed rod 284 and one or more coils 234 for heating the pedestal 230 and wafer thereupon, a cooling tube assembly 236 disposed within a recess 238 in the pedestal. A plurality of rest buttons 248 are disposed on the pedestal 230 proximate an outer edge 250 of the pedestal 230 (see FIG. 3). The rest buttons 248 support the wafer 210 upon the pedestal assembly 212 while providing a minimum amount of wafer backside contamination (i.e., extraneous deposition material or scratching from multiple point contacts. The rest buttons 248 are hollow and are provided in a plurality of hollow portions 280 of the pedestal 230 and isolator ring 240 to form a passage from the bottom of the chamber to the semiconductor wafer for a lift pin (not shown) to contact.

In a preferred embodiment of the invention, there are three rest buttons equidistantly spaced apart from each other on the pedestal preferably on a circle of radius approximately 2–3.5 cm. The rest buttons 248 are constructed from an insulating material, preferably the same material as that of the insulator ring 240 (i.e., a ceramic such as alumina or aluminum nitride). A gasket 252 is disposed upon a circumferential lip 254 of the pedestal 230. The gasket 252 is metallic and preferably a soft, malleable material such as copper. Additional gaskets 252 are disposed radially inward of the circumferential lip 254 and are seen in FIG. 2.

A pedestal cover 256 is disposed over and covers the pedestal 230. Specifically, the pedestal cover 256 contacts the gasket 252. A plurality of openings 278 are provided in the pedestal cover 256 to allow the rest buttons to pass therethrough and to support the wafer 210 above pedestal cover. Preferably, there are an equal number of rest buttons 248 and corresponding openings 278. The pedestal cover 256 is preferably constructed from a conductive material such as stainless steel. Additional electrical properties and features of the pedestal cover are discussed below. The pedestal cover 256 is further provided with one or more recesses 258 within which fastening members can be disposed for fastening the pedestal cover 256 to the pedestal 230. In a preferred embodiment of the invention, four recesses are formed in the pedestal cover 256. These recesses align with one or more bores 260 in the pedestal 230 within which fastening means, i.e., studs, screws and the like communicate to secure the pedestal cover 256 to the pedestal 230.

Figure 4:
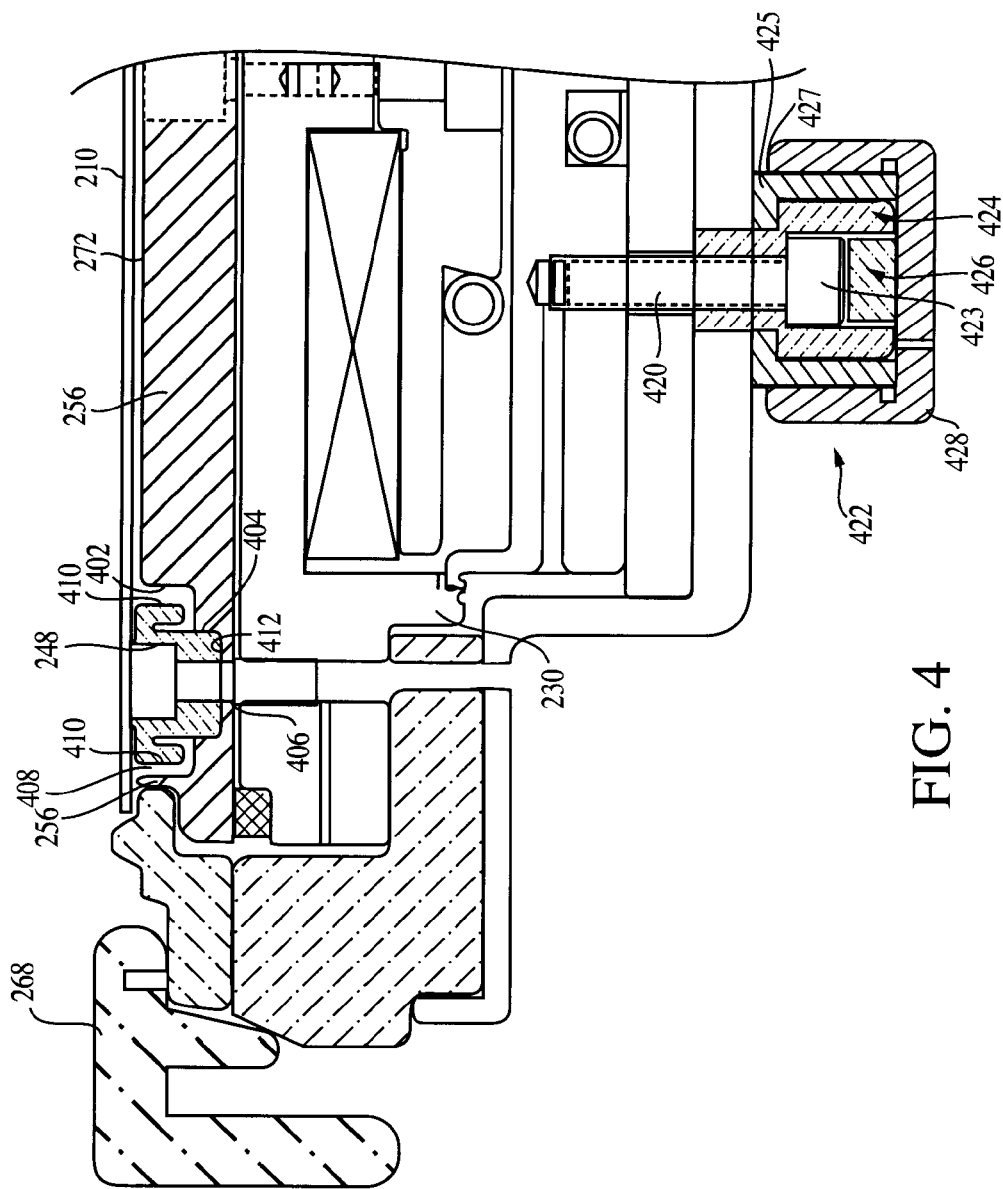
FIG. 4 is a detailed cross-sectional view of a second embodiment of the inventive apparatus and showing additional features of the subject invention.

An alternate embodiment of the pedestal cover 256 is provided in FIG. 4. Specifically, the rest buttons 248 do not directly contact the pedestal 230. Instead, the plurality of openings 278 are replaced with a plurality of graduated diameter openings. A first graduated diameter 402 is the largest and extends down from the upper surface 272 of the pedestal cover 256. The first graduated diameter opening 402 transitions into a second graduated diameter opening 404. Finally, the second graduated diameter opening 404 transitions into a third graduated diameter opening 406. The first graduated diameter opening 402 and sidewalls 410 of the rest buttons 248 form a labyrinth like gap 408 similar to the gap 300 seen FIG. 3 and described below. The rest buttons 248 are actually disposed upon a lower pedestal cover surface 412 that is formed by the second graduated diameter opening 404. The third graduated diameter opening 406 allows lift pins below (not shown) access to the wafer 210.

FIG. 4 additionally shows another feature of the present invention. Specifically, a fastener 420 is provided in the pedestal assembly 212 to fasten some of the components. Fastener 420 is preferably a bolt or similar device that engages the lower shield member 220, insulating plate member 226 and pedestal 230 to secure these components together. Since the fastener 420 is in contact with the pedestal 230, it is "RF hot." To guard against electrical contact between the fastener and another conductor (i.e. stray plasma in lower regions of the chamber), it is provided with a shield 422. The shield comprises a plurality of parts including: an insulating collar 424 disposed in the lower shield member 220, an insulating cap 426 disposed over a head 423 of the fastener 420, a collar skirt 425 disposed radially outward of the insulating collar and having a threaded outer surface 427 and a shield cap 428 that threads over the collar skirt 425.

Returning to FIG. 3, a waste ring 262 circumscribes the pedestal cover 256 and is disposed on top of the isolator ring 240. Preferably the waste ring is an insulating material and in a preferred embodiment of the invention is the same material as the isolator ring 240, i.e., a ceramic such as alumina or aluminum nitride. The waste ring 262 is further provided with an indexing tab 264 which meets and communicates with a notch 266 on the isolator ring. The indexed tab 264 and notch 266 provide positive orientation between these two components and eliminates shifting of the components during chamber operation. A cover ring 268 is disposed radially outwards of the waste ring 262 and isolator ring 240. Specifically, cover ring 268 contacts a portion of the waste ring 262 and isolator ring 240. The cover ring has an upper surface 302 that transitions to a 180° curved face 304 that abuts the waste ring 262. The curved face 304 then transitions to a notch 308 in an underside 310 of the cover ring 268.

As can be seen from FIG. 2 and the close-up in FIG. 3, a number of labyrinth like gaps are created when all of the components are assembled in the manner shown and described. Specifically, with the cover ring 268 disposed on top of the waste ring 262 as shown, a first labyrinth like gap 300 is created between these two components. A second labyrinth lik gap 308 extends from the top of the waste ring 262 to a point where the pedestal 230 and insulator plate 226 contact each other. These complex pathways reduce the possibility of stray deposition buildup which can result in a conductive pathway forming between a conductive portion of the pedestal assembly and a non-connective portion. For example, if sputtered material cannnot easily form a conductive path from an RF powered surface (i.e., the wafer or pedestal cover ring) the waste ring or cover ring does not couple to the RF power. Although only a single notch is used to form the labyrith like gap at the cover ring 268 it will be understood that any number or type of surface features may be incorporated into the cover ring, waste ring, isolator ring or any other pedestal assembly component to define a gap necessary to reduce the buildup of sputtered material that may create a conductive pathway. Such features may include but are not limited to multi-layer ring structures with integrated labyrinth surfaces, a plurality of notches on a single ring structure or the like.

Similar to the plasma formation in the prior art chamber 100, a plasma 214 is created in the subject chamber 200 by ionization of a process gas in a reaction zone 274. Additionally, the wafer 210 is negatively biased via the electrode(s) 232, and RF power source 276. The optimal conductive path for the RF power is from the pedestal 230, through the wafer 210, to the plasma 214, to a grounded chamber component (i.e., shield member 206). The amount of RF wafer biasing power coupling through rings 240, 262 and 268 is significantly reduced. As such, the power more readily couples through the pedestal cover 256. That is, when the wafer 210 sits on the rest buttons 248, a gap is created between a bottom side of the wafer and an upper surface 272 of the pedestal cover 256. The gap prevents the aforementioned undesirable conductive film buildup. As such, RF power cannot find an alternate conductive path and remains coupled through the wafer 210.

The pedestal cover 256 is fabricated from either a highly conductive or a semiconductive material based on the frequency of the RF biasing power to be used during wafer processing. At low frequencies (f<1 MHz), impedance levels at the wafer remain high. To optimally couple RF power from the pedestal through the wafer at low frequencies, a highly conductive path is desirable. Under these conditions, the pedestal cover 256 may be fabricated completely from a highly conductive material (i.e., stainless steel) to provide a highly conductive path. If a high frequency (f>10 MHz) RF power source is used, the pedestal cover 256 may be fabricated completely from a semiconductive material (i.e., ceramic or quartz). At high frequencies, impedance levels at the wafer as well as other chamber components are low. To prevent RF power from coupling through other potentially low impedance pathways (i.e., through the cover ring 268) a barrier must be established. Fabricating the pedestal cover 256 from a semiconductive material provides an electrical barrier between the intended path (i.e., from the pedestal 230, through the pedestal cover 256 and wafer 210, to the plasma 214 and to a grounded chamber component (i.e., shield member 206) and other paths (i.e., through rings 240, 262 and 268).

Although the materials for fabricating the pedestal cover portions are disclosed, this does not preclude using other types of materials or combining different materials into the same pedestal cover. For example, for high frequency applications, it has been disclosed that the pedestal cover can be fabricated completely from an semiconductive material. In an alternate embodiment of a high frequency application, the pedestal cover may be fabricated from a conductive material (i.e., stainless steel) In this way, more effective power coupling occurs where it is needed (at the wafer) and the insulating barrier is provided where it is needed (at the rings 240, 262, 268).

Thus, the subject invention solves the problem of inconsistent and nonuniform voltage levels coupling at the wafer and the resultant nonuniform plasma conditions and deposition layer. The optimal pathway to couple RF power to a plasma is electrically isolated and well defined by the invention. This prevents RF power coupling on neighboring surfaces.

Although various embodiments which incorporate the teachings of the present invention have been shown and described in detail herein, those skilled in the art can readily devise many other varied embodiments that still incorporate these teachings.

What is claimed is:

1. Apparatus for improved power coupling through a substrate in a process chamber comprising:
    a pedestal assembly disposed within the chamber, said pedestal assembly having a pedestal;
    a plurality of rest buttons supported by and disposed within apertures formed in said pedestal;
    a pedestal cover disposed over the pedestal partially exposing the rest buttons; and
    an insulative isolator ring at least partially disposed radially outward of the pedestal.

2. The apparatus of claim 1 wherein the pedestal assembly further comprises:
    a lower shield member; and
    an insulating plate member disposed upon the lower shield member wherein the pedestal is disposed upon said insulating plate member.

3. The apparatus of claim 2 wherein the pedestal cover is further provided with one or more recesses and the pedestal is further provided with one or more bores wherein the recesses and bores align and allow communication of fastening means to secure the pedestal cover to the pedestal.

4. The apparatus of claim 3 wherein the pedestal assembly further comprises an isolator ring disposed upon an outer flange portion of the lower shield member.

5. The apparatus of claim 4 wherein the isolator ring is L-shaped such that a lower, horizontal portion of said isolator ring is below and spaced apart from the pedestal.

6. The apparatus of claim 5 wherein the pedestal assembly is further provided with a plurality of rest buttons for supporting the substrate.

7. The apparatus of claim 6 wherein the plurality is three.

8. The apparatus of claim 7 wherein the rest buttons are hollow, ceramic and axially coincide with hollow portions of the pedestal, hollow portions of the isolator ring and hollow portions of the lower shield member.

9. The apparatus of claim 1 wherein the pedestal cover is fabricated from semiconducting material.

10. The apparatus of claim 9 wherein the pedestal cover is fabricated from a material selected from the group consisting of quartz and ceramic.

11. The apparatus of claim 1 wherein the pedestal cover is fabricated from a conductive material.

12. The apparatus of claim 11 wherein the pedestal cover is fabricated from stainless steel.

13. The apparatus set forth in claim 1, further comprising a waste ring positioned above the insulative isolator ring, wherein the waste ring and insulative isolator ring partially defines a labyrinth.

14. Apparatus for improved power coupling through a substrate in a processing chamber comprising:

a pedestal assembly; and a pedestal cover positioned over the pedestal assembly, the pedestal assembly further comprising:

a lower shield member;

an insulating plate member disposed upon the lower shield member;

a pedestal disposed upon the insulating plate member;

an insulative isolator ring disposed upon an outer flange portion of the lower shield member such that a lower, horizontal portion of said isolator ring is below and spaced apart from the pedestal;

a plurality of rest buttons supported in a plurality of hollow portions in the pedestal and passing through a plurality of openings in the pedestal cover.

15. The apparatus of claim 14 wherein pedestal cover is fabricated from semiconducting material.

16. The apparatus of claim 15 wherein the pedestal cover is fabricated from ceramic.

17. The apparatus of claim 14 wherein the pedestal cover is fabricated from a conductive material.

18. The apparatus of claim 17 wherein the pedestal cover is fabricated from stainless steel.

19. The apparatus of claim 14 wherein the pedestal assembly further comprises one or more rings proximate the insulative isolator ring to further improve power coupling.

20. The apparatus of claim 19 wherein said one or more rings is a ceramic waste ring disposed on top of the insulative isolator ring.

21. The apparatus set forth in claim 20, wherein the ceramic waste ring partially defines a labyrinth.

22. The apparatus of claim 19 wherein said one or more rings is a cover ring disposed radially outward of and contacting the insulative isolator ring.

* * * * *

UNITED STATES PATENT AND TRADEMARK OFFICE
CERTIFICATE OF CORRECTION

PATENT NO. : 6,723,214 B2
DATED : April 20, 2004
INVENTOR(S) : Bradley O. Stimson et al.

It is certified that error appears in the above-identified patent and that said Letters Patent is hereby corrected as shown below:

<u>Title page,</u>
Item [*] Notice, please change "bydays.days." to -- by 273 days --.

Signed and Sealed this

Fourteenth Day of December, 2004

JON W. DUDAS
*Director of the United States Patent and Trademark Office*